US011269742B2

(12) United States Patent
Nayyar et al.

(10) Patent No.: US 11,269,742 B2
(45) Date of Patent: Mar. 8, 2022

(54) INTEGRATED CIRCUIT CHIP WITH CORES ASYMMETRICALLY ORIENTED WITH RESPECT TO EACH OTHER

(71) Applicant: TEXAS INSTRUMENTS INCORPORATED, Dallas, TX (US)

(72) Inventors: Jasbir Singh Nayyar, Bangalore (IN); Shashank Srinivasa Nuthakki, Telangana (IN); Rahul Gulati, Bangalore (IN); Arun Shrimali, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 55 days.

(21) Appl. No.: 16/838,176

(22) Filed: Apr. 2, 2020

(65) Prior Publication Data

US 2020/0233758 A1   Jul. 23, 2020

Related U.S. Application Data

(63) Continuation of application No. 15/991,127, filed on May 29, 2018, now Pat. No. 10,649,865, which is a
(Continued)

(51) Int. Cl.
*G06F 11/16* (2006.01)
*G06F 30/39* (2020.01)
(Continued)

(52) U.S. Cl.
CPC ............ *G06F 11/16* (2013.01); *G06F 11/004* (2013.01); *G06F 11/1641* (2013.01);
(Continued)

(58) Field of Classification Search
CPC .... G06F 11/16; G06F 11/004; G06F 11/1641; G06F 17/5068; G06F 11/1679; H01L 28/00; H01L 23/562
See application file for complete search history.

(56) References Cited

U.S. PATENT DOCUMENTS

| | | | |
|---|---|---|---|
| 4,517,673 A | 5/1985 | Brown et al. | |
| 5,005,174 A | 4/1991 | Bruckert et al. | |
| (Continued) | | | |

FOREIGN PATENT DOCUMENTS

| | | |
|---|---|---|
| CN | 101634959 A | 1/2010 |
| CN | 101916218 A | 12/2010 |
| (Continued) | | |

OTHER PUBLICATIONS

National Intellectual Property Administration, PRC, Notification of First Office Actiion, Application No. 20168002454726, dated Oct. 27, 2020.
(Continued)

*Primary Examiner* — Kyle Vallecillo
(74) *Attorney, Agent, or Firm* — Ebby Abraham; Charles A. Brill; Frank D. Cimino

(57) ABSTRACT

An integrated circuit (IC) chip can include a given core at a position in the IC chip that defines a given orientation, wherein the given core is designed to perform a particular function. The IC chip can include another core designed to perform the particular function. The other core can be flipped and rotated by 180 degrees relative to the given core such that the other core is asymmetrically oriented with respect to the given core. The IC chip can also include a compare unit configured to compare outputs of the given core and the other core to detect a fault in the IC chip.

12 Claims, 3 Drawing Sheets

Related U.S. Application Data continuation of application No. 14/854,900, filed on Sep. 15, 2015, now Pat. No. 10,002,056.

(51) Int. Cl.
 *H01L 49/02* (2006.01)
 *G06F 11/00* (2006.01)
 *H01L 23/00* (2006.01)

(52) U.S. Cl.
 CPC .............. *G06F 30/39* (2020.01); *H01L 28/00* (2013.01); *G06F 11/1679* (2013.01); *H01L 23/562* (2013.01)

(56) References Cited

U.S. PATENT DOCUMENTS

| | | | |
|---|---|---|---|
| 5,048,022 A | 9/1991 | Bissett et al. | |
| 5,054,026 A | 10/1991 | Tsubota | |
| 5,295,258 A | 3/1994 | Jewett et al. | |
| 5,434,997 A | 7/1995 | Landry et al. | |
| 5,630,045 A | 5/1997 | Krygowski et al. | |
| 5,675,807 A | 10/1997 | Iswandhi et al. | |
| 5,692,152 A | 11/1997 | Cohen et al. | |
| 5,701,507 A | 12/1997 | Bonneau, Jr. et al. | |
| 5,732,209 A | 3/1998 | Vigil et al. | |
| 5,838,899 A | 11/1998 | Leavitt et al. | |
| 6,061,599 A | 5/2000 | Rhodehamel et al. | |
| 6,526,559 B2 * | 2/2003 | Schiefele ............ G06F 11/1497 326/101 |
| 6,694,449 B2 | 2/2004 | Ghameshlu et al. | |
| 6,883,065 B1 | 4/2005 | Pittelkow et al. | |
| 7,055,060 B2 | 5/2006 | Nguyen et al. | |
| 7,290,169 B2 | 10/2007 | Safford et al. | |
| 7,624,302 B2 | 11/2009 | Michaelis et al. | |
| 7,653,764 B2 | 1/2010 | Mizutani | |
| 7,873,830 B2 | 1/2011 | Fayad et al. | |
| 7,937,682 B2 | 5/2011 | Arunachalam et al. | |
| 8,058,916 B2 | 11/2011 | Steiner | |
| 8,120,938 B2 | 2/2012 | Moore et al. | |
| 8,265,100 B2 | 9/2012 | Steiner et al. | |
| 8,392,856 B2 | 3/2013 | Misaka et al. | |
| 8,489,919 B2 | 7/2013 | Clark et al. | |
| 8,823,411 B2 | 9/2014 | League | |
| 8,924,772 B2 | 12/2014 | Abe | |
| 9,329,927 B2 | 5/2016 | Ito | |
| 9,367,375 B2 | 6/2016 | Cornes et al. | |
| 9,588,937 B2 | 3/2017 | Alvarez-Icaza Rivera | |
| 2002/0065986 A1 | 5/2002 | Jeffrey et al. | |
| 2002/0157071 A1 | 10/2002 | Schiefele et al. | |
| 2007/0277023 A1 | 11/2007 | Weiberle et al. | |
| 2010/0060313 A1 | 3/2010 | Momose | |
| 2012/0066551 A1 | 3/2012 | Palus et al. | |
| 2012/0173924 A1 | 7/2012 | Xiao | |
| 2013/0007046 A1 * | 1/2013 | Baum ................ G06F 13/4022 707/769 |
| 2013/0238945 A1 | 9/2013 | Vilela | |
| 2014/0115401 A1 * | 4/2014 | Ito ...................... G06F 11/1695 714/37 |
| 2014/0258684 A1 | 9/2014 | Hastie | |
| 2014/0325183 A1 | 10/2014 | Rozen et al. | |
| 2015/0019779 A1 | 1/2015 | Hirade et al. | |
| 2015/0235998 A1 | 8/2015 | Moran et al. | |
| 2015/0278400 A1 | 10/2015 | Mattson et al. | |
| 2016/0034368 A1 * | 2/2016 | Nishii ................ G06F 11/1645 714/11 |
| 2016/0092320 A1 | 3/2016 | Baca | |
| 2016/0179162 A1 * | 6/2016 | Eastep ................. G06N 20/00 713/320 |
| 2016/0188519 A1 | 6/2016 | Wagh et al. | |
| 2016/0283314 A1 | 9/2016 | Thanner et al. | |

FOREIGN PATENT DOCUMENTS

| | | |
|---|---|---|
| CN | 102360311 A | 2/2012 |
| CN | 103744775 A | 4/2014 |
| CN | 103995759 A | 8/2014 |
| CN | 104021057 A | 9/2014 |
| GB | 2340627 | 2/2000 |
| JP | 200257083 | 2/2002 |

OTHER PUBLICATIONS

First CN Office Action for Application No. 20168002454726; dated Oct. 27, 2020; 21 pages.
China National Intellectual Property Administration Search Report for CN Application No. 2016800454726; 3 pages.
Report of First Office Action; Chinese Patent Application No. 20168020454726; dated Nov. 10, 2020; 3 pages.
Tummeltshammer, P., et al.,"On the Risk of Fault Coupling over the Chip Substrates." 2009 12th Euromicro Conference on Digital System Design/Architectures, Methods and Tools, IEEE, Conference Location: Patras, Greece, Date of Conference: Aug. 27-29, 2009. (Year: 2009).

* cited by examiner

INTEGRATED CIRCUIT CHIP WITH CORES ASYMMETRICALLY ORIENTED WITH RESPECT TO EACH OTHER

CROSS-REFERENCE TO RELATED APPLICATIONS

This application is a Continuation of application Ser. No. 15/991,127 filed May 29, 2018, which is a Continuation of application Ser. No. 14/854,900 filed Sep. 15, 2015, now U.S. patent Ser. No. 10/002,056, all of which are incorporated herein by reference in their entirety.

TECHNICAL FIELD

This disclosure relates to an integrated circuit (IC) chip with multiple cores. More particularly, this disclosure relates to an IC chip with a given core and another core that are asymmetrically oriented with respect to each other.

BACKGROUND

Lockstep systems are fault-detection CPU systems that redundantly execute the same set of operations at the same time in parallel. The redundancy allows error detection. In particular, the output from lockstep operations can be compared to determine if there has been a fault if there are at least two systems (dual modular redundancy).

To run in lockstep, each redundant system is set up to progress from one well-defined state to the next well-defined state. When a new set of inputs reaches the system, each redundant system processes the new set of inputs, generates new outputs and updates a respective state. This set of changes (new inputs, new outputs and new state) is considered to define that step, and is treated as an atomic transaction. In other words, either all of the set of changes happen, or none of set of changes happen, and not something in between.

SUMMARY

One example relates to an integrated circuit (IC) chip. The IC chip can include a given core at a position in the IC chip that defines a given orientation, wherein the given core is designed to perform a particular function. The IC chip can include another core designed to perform the particular function, the other core being flipped and rotated by 180 degrees relative to the given core such that the other core is asymmetrically oriented with respect to the given core. The IC chip can further include a compare unit configured to compare outputs of the given core and the other core to detect a fault in the IC chip.

Another example relates to another IC chip. The IC chip can include a non-transitory machine readable memory configured to store data. The IC chip can also include a pair of matched cores configured to operate in lockstep. The pair of matched cores can include a given core and another core. The other core can be flipped and rotated by 180 degrees relative to the given core such that the other core is asymmetrically oriented with respect to the given core. The IC chip can further include a compare unit configured to compare outputs of the given core and the other core to detect a fault in the IC chip.

Yet another example relates to a method that can include positioning a given core of a pair of matched cores of an IC chip. The method can also include flipping another core of the pair of matched cores relative to the given core. The method can further include rotating the other core of the pair of matched cores relative to the given core by an angle of 180 degrees. The method can yet further include positioning the flipped and rotated other core on the IC chip such that the other core is asymmetrically oriented with respect to the given core.

DETAILED DESCRIPTION

An integrated circuit (IC) chip can include a given core that defines a given orientation, wherein the given core is designed to perform a particular function. The IC chip can include another core designed to perform the particular function. The given and the other core can be formed with the same microchip architecture, such that the other core is a replica of the given core. The other core can be flipped and rotated by 180 degrees relative to the given core such that the given core and the other core are asymmetrically aligned with respect to each other. In this manner, no point in space is equidistance to replicated regions of the given core and the other core. The IC chip can also include a compare unit configured to compare outputs of the given core and the other core to detect a fault in the IC chip. By asymmetrically orienting the given and other core with respect to each other, the probability of a Common Cause Fault (CCF) can be reduced.

Figure 1:
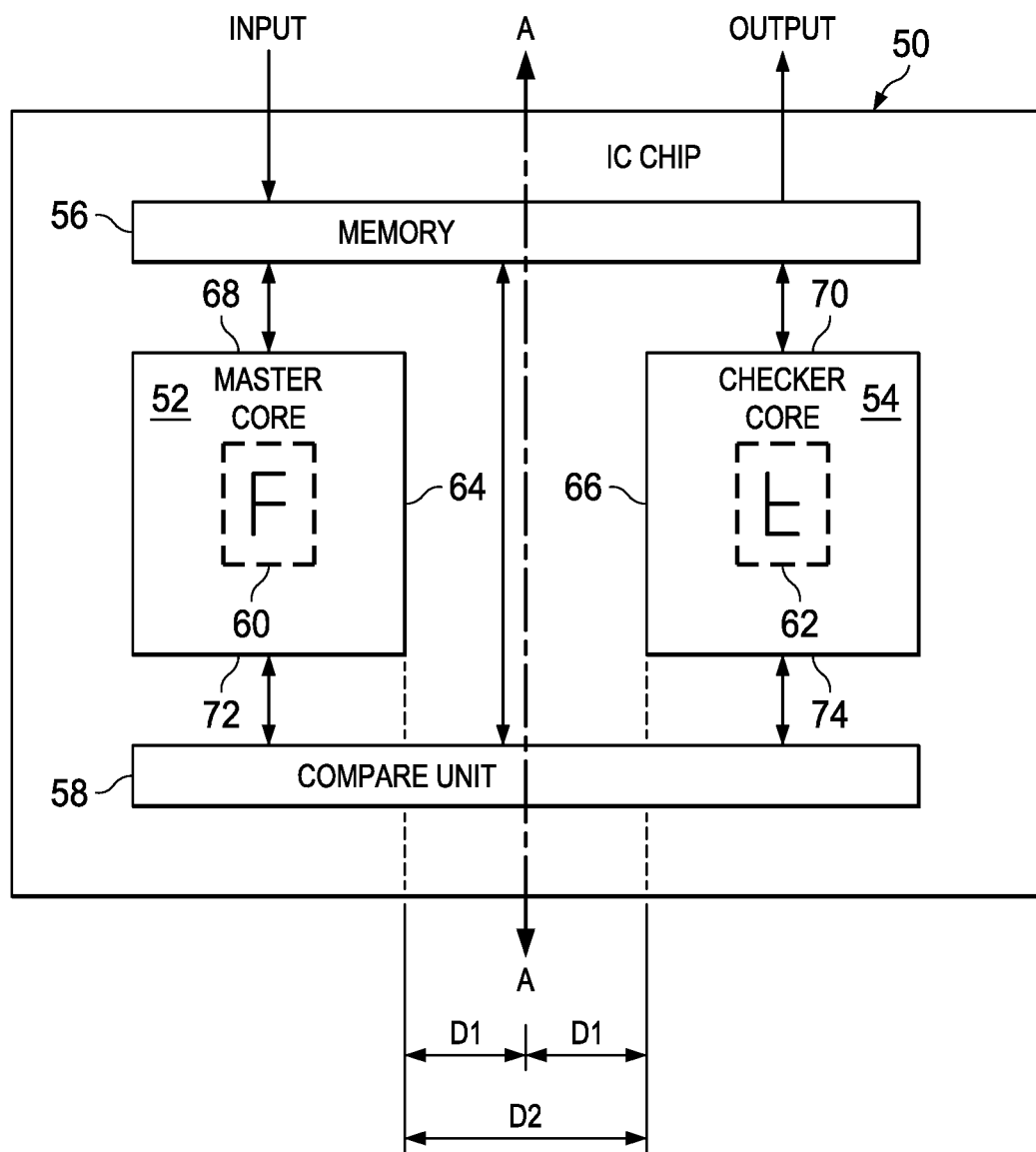
FIG. 1 illustrates an example of an integrated circuit (IC) chip with asymmetrically oriented cores.

FIG. 1 illustrates an example of an IC chip 50 that can be employed to reduce a probability of a CCF. The IC chip 50 can include two cores on a single substrate (e.g., die), namely a master core 52 and a checker core 54. Each of the master core 52 and the checker core 54 can be implemented as a macroblock. As used herein, a macroblock can be a discrete set of circuit components (e.g., transistors, resistors, capacitors and/or inductors) arranged on the IC chip 50 to perform a particular function or set of functions. In some examples, there could be thousands or millions of circuit components in a single macroblock. For instance, the master core 52 and the checker core 54 could be general processor cores, processor cores with embedded instructions, application specific cores, etc. It is noted that the terms "master core" and "checker core" do not denote (or exclude) any particular hierarchy of the cores of the IC chip 50. Instead, the terms "master core" and "checker core" are employed to simplify the present explanations and examples used herein.

The master core 52 and the checker core 54 can be implemented as a pair of matched cores (or more generally, matched macroblocks). As used herein, the term "matched cores" (or matched macroblocks) indicates a pair of cores that have the same logical design and perform the same function. That is, each core in the pair of matched cores is a replica of the other core. Thus, the master core 52 and the checker core 54 can be implemented as the same logical design and with the same circuit components. The master core 52 and the checker core 54 can operate in lockstep. That is, the master core 52 and the checker core 54 can be implemented as a redundant pair of cores that execute the same instructions at substantially the same time. The IC chip 50 can be implemented, for example, on a safety device, wherein false positives and/or false negatives need to be avoided as much as possible in the manner described herein.

For example, the master core 52 and the checker core 54 can receive an input and generate an output in response to the input. In some examples, the input can be provided from a memory 56. The memory 56 could be a non-transitory machine readable medium, such as volatile or non-volatile random access memory (RAM). In other examples, the input could be provided from an external system (e.g., a sensor).

The IC chip 50 can also include a compare unit 58. The compare unit 58 can be implemented as a macroblock of the IC chip 50. The compare unit 58 can compare the output of the master core 52 and the checker core 54 to determine if both the master core 52 and the checker core 54 are functioning properly.

As noted, the IC chip 50 can be implemented in a safety system. For instance, the IC chip 50 can be employed to comply with safety standards set forth in the International Standards Organization (ISO)-26262 specifications. In a given example (hereinafter, "the given example"), the IC chip 50 can be implemented on/as a controller for an airbag deployment system. In the given example, the memory 56 can receive an input signal from a crash sensor and/or an accelerometer. The master core 52 and the checker core 54 can each execute an algorithm that can monitor the input to determine whether an output signal that causes deployment of an airbag should be activated.

In the given example, in a this situation, it is presumed that the input to the IC chip 50 would be indicative of "no crash detected" (e.g., normal operations). In such a situation, both the master core 52 and the checker core 54 would generate output data that can be provided to the memory 56 and/or the compare unit 58. The compare unit 58 can compare the output data. As noted, in this situation (if functioning properly), both the master core 52 and the checker core 54 will output data indicating that the airbag is not to be deployed.

In the same situation, if either the master core 52 or the checker core 54 generates output data indicating that the airbag is to be deployed, and the other of the master core 52 and the checker core 54 generates conflicting output data indicating that the airbag is not to be deployed, the compare unit 58 can detect the conflict and generate a fault for the IC chip 50. The fault for the IC chip 50 can indicate that one of the master core 52 and the checker core is malfunctioning.

However, there are situations where both the master core 52 and the checker core 54 are malfunctioning concurrently due to the same disturbance, which can be referred to as a common cause failure (CCF). A CCF can occur due to thermal and/or a mechanical stress in the IC chip 50. As used herein, terms "thermal stress" and "mechanical stress" can include nearly any form of stress that adversely impacts silicon (or other material) in the IC chip 50. Moreover, in many situations, such thermal and/or mechanical stress can propagate and/or radiate from a particular point or area on the IC chip 50. The originating source of the thermal and/or mechanical stress could be external to the IC chip 50. In other examples, the source of the thermal and/or mechanical stress can be internal with respect to the IC chip 50.

Each of the master core 52 and the checker core 54 can have a particular (physical) orientation. As used herein, the orientation of the cores of the IC chip 50 define the angular position in three dimensional space of a corresponding core. The orientation of the master core 52 can be represented by a symbol 60 illustrated in FIG. 1. Moreover, the checker core 54 also has an orientation represented by a symbol 62 illustrated in FIG. 1. The orientation 62 of the checker core 54 is asymmetric relative to the orientation 60 of the master core 52.

As noted, the checker core 54 includes the same components as the master core 52. The master core 52 can be positioned somewhere on the IC chip 50 to define the orientation 60 of the master core 52. Relative to the orientation 60 of the master core 52, the checker core 54 can be flipped and rotated 180 degrees (or within 1 degree of 180 degrees). The flipping and rotating of the checker core 54 relative to the master core 52 can ensure the orientation 62 of the checker core 54 has an asymmetric orientation relative to the orientation 60 of the master core 52. As is illustrated in FIG. 1, the orientation of the master core 52 and the checker core 54 are represented with the same symbol, with the checker core 54 being flipped and rotated by 180 degrees. Additionally, in some examples, the checker core 54 can be positioned such that an edge 64 of the master core 52 and an edge 66 of the checker core 54 are equidistant from an axis, denoted with line A-A, which distances are represented in FIG. 1 as D1. Similarly, two corners of the master core 52 can have the same distance between two respective closest corners of the checker core 54, which distances are represented in FIG. 1 as D2.

Additionally, in some examples, the master core 52 and the checker core 54 can be aligned. In such a situation, an edge 68 of the master core 52 and an edge 70 of the checker core 54 that are perpendicular to the edge 64 of the master core 52 and the edge 66 of the checker core 54 extend along a common plane. Additionally or alternatively, an edge 72 of the master core 52 that opposes the edge 68 and an edge 74 of the checker core 54 that opposes the edge 70 of the checker core can extend along another common plane.

As used herein, the term "asymmetric orientation" of a given core denotes an orientation relative to a replica core on a common IC chip, wherein electrical components of the given core and replica electrical components of the replica core are not equidistant from a point in space, including any point on the IC chip. For example, assuming the IC chip 50 is drawn to scale, there is no point on the IC chip 50 that would be equidistant to replicated electrical components on both the master core 52 and the checker core 54.

By flipping and rotating the checker core 54 180 degrees with respect to the master core 52, asymmetric orientation between the master core 52 and the checker core 54 can be achieved. Moreover, this specific arrangement of flipping and rotating the checker core 54 by 180 degrees with respect to the master core 52 avoids reliability issues related to poly orientation. Such reliability issues can arise in situations where the IC chip 50 is formed with microfabrication techniques on a scale of 45 nanometers (nm) or smaller.

Thermal and/or mechanical stress may be propagated and/or radiated from the source of stress at a relatively low speed as compared to the operational speed of the master core 52 and the checker core 54. By ensuring that the master core 52 and the checker core 54 are asymmetrically oriented relative to each other, a thermal and/or mechanical stress emanating from a particular point or area of on the IC chip 50 would propagated to the master core 52 and the checker core 54 at different times, thereby reducing the probability of a CCF. Stated differently, the stress from a stress source (e.g., a point or area of thermal and/or mechanical stress) that radiates and/or propagates a thermal or mechanical stress would reach a common region (a region formed of the same electrical components) of either the master core 52 or the checker core 54 at different times. Thus, the probability of both the master core 52 and the checker core 54 malfunctioning at substantially the same time is reduced. Instead, it is more likely that the thermal and/or mechanical stress would cause a malfunction in one of the master core 52 and the checker core 54 prior to causing the same malfunction in the other of the master core 52 and the checker core 54. Moreover, once such a malfunction occurred, the compare unit 58 can detect the malfunction and report a fault in the manner described herein prior to the occurrence of a CCF.

Figure 2:
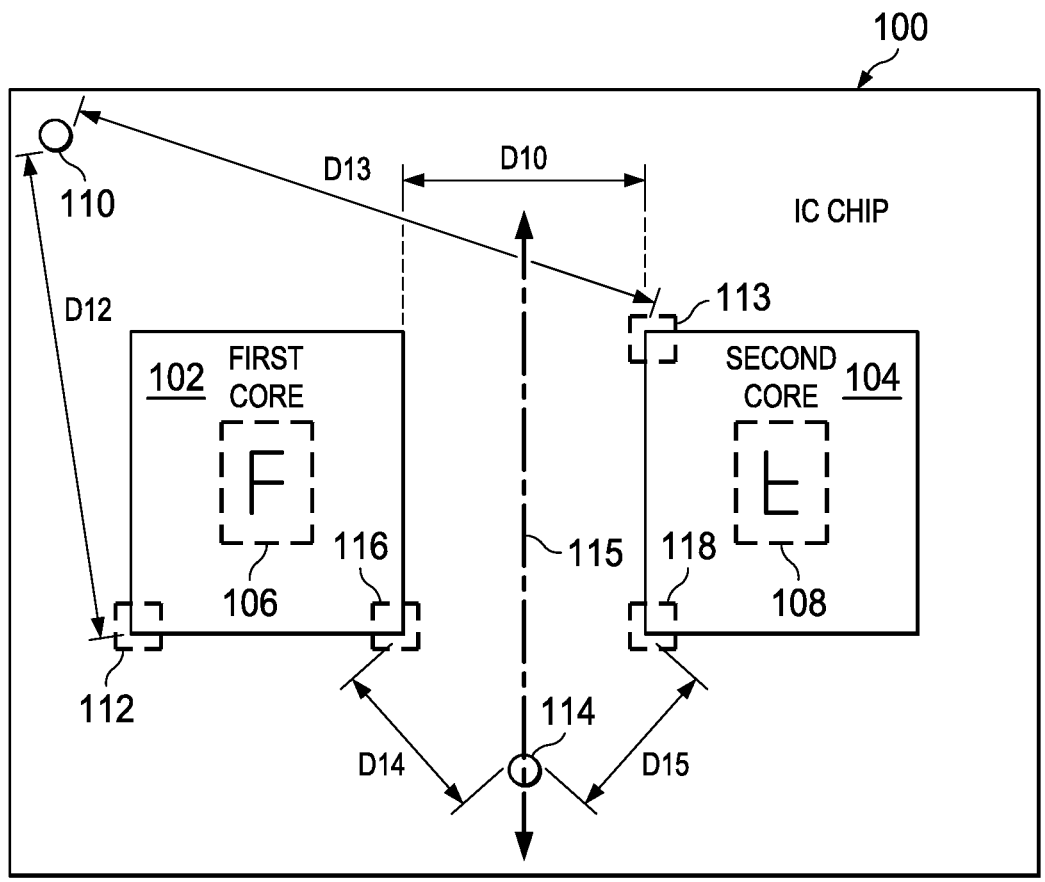
FIG. 2 illustrates a conceptualized example of asymmetrical orientation of cores of an IC chip.

FIG. 2 illustrates the concept of two cores of an IC chip 100 that are asymmetrically oriented with respect to each other. The IC chip 100 can be implemented in a manner similar to the IC chip 50 illustrated in FIG. 1. For purposes of simplification of explanation, it is presumed that the IC chip 100 is drawn substantially to scale. The IC chip 100 can include a first core 102 and a second core 104. The first core 102 can be formed in a manner similar to the master core 52 illustrated in FIG. 1. Similarly, the second core 104 can be formed in a manner similar to the checker core 54 illustrated in FIG. 1. Thus, the first core 102 and the second core 104 can include the same electrical components arranged to perform the same functions. That is, the second core 104 is a replica of the first core 102 and vice versa. Moreover, the first core 102 and the second core 104 can operate in lockstep.

The orientation of the first core 102 can be represented by a symbol 106. The second core 104 can be flipped and rotated by 180 degrees relative to the first core 102 to ensure that the second core 104 and the first core 102 have an asymmetrical orientation relative to each other. Thus, no point in space is equidistant from the same region of replicated electrical components of the first core 102 and the second core 104. To illustrate this concept, the first core 102 and the second core 104 are separated by a distance along an edge of the first core 102 and an edge of the second core 104, D10. Moreover, similarly to the master core 52 and the checker core 54 of FIG. 1, the first core 102 and the second core 104 can be positioned such that two corners of the first core 102 are equidistant from two respective closest corners to the second core 104.

A first stress source 110 can apply thermal and/or mechanical stress to the first core 102 and the second core 104. The first stress source 110 can be a point or area from which thermal and/or mechanical stress radiates and/or propagates. The first stress source 110 can have a particular distance, D12 from a specific region 112 of the first core 102. The specific region 112 of the first core can be an area, including, but not limited to a side of the first core 102 with a specific set of electrical components. The second core 104 can also include a replica of the specific region 112 of the first core 102, namely a specific region 113 of the second core 104. However, since the first core 102 and the second core 104 are asymmetrically oriented with respect to each other, the specific region 112 in the first core 102 has a different location that than the specific region 113 in the second core 104. The specific region 112 of the first core 102 and the specific region 113 can be referred to as replica regions of the cores, since the specific region 112 of the first core 102 includes the same circuit components of the specific region 113 of the second core 104. The first stress source 110 is a distance, D13 from the specific region 112 of the second core 104. As is illustrated in FIG. 2, the distances D12 and D13 are not equal, and in the example illustrated in FIG. 2, D13 is greater than D12. Thus, stress radiating and/or propagating from the first stress source 110 would affect the first core 102 and the second core 104 at different rates. In particular, more of the stress propagated and/or radiated from the first stress source 110 would be absorbed by the first core 102 than the second core 104.

As another example of asymmetric orientation, a second stress source 114 that is a point along a neutral symmetric axis 115. The neutral symmetric axis 115 can be equidistant from the first core 102 and the second core 104. The second stress source 114 can radiate and/or propagate a thermal and/or a mechanical stress to the first core 102 and the second core 104. A corner 116 of the first core 102 is separated from the second stress source 114 by a distance of D14. Moreover, a corner 118 the second core 104 is separated from the second stress source 114 by a distance of D15. In this situation, it is presumed that D14 and D15 are equal (or nearly equal). However, due to the asymmetric orientation between the first core 102 and the second core 104, the electrical components at the corner 116 of the first core 102 and the electrical components at the corner 118 of the second core are different. That is, the corner 118 of the second core 104 is not a replicated region of the corner 116 of the first core 102. Therefore, the stress emanated from the second stress source 114 does not affect the first core 102 in the same manner as the second core 104.

As explained, due to the asymmetric orientation of the second core 104 relative to the first core 102, the first stress source 110 and the second stress source 114 radiate and/or propagate thermal and/or mechanical stress to the first core 102 and the second core 104 at different times and/or in different areas. In this manner, the probability of a CCF occurring at the same time (or near the same time) is reduced. Instead, it is more likely that the stress applied by the first stress source 110 would cause a malfunction in the first core 102 prior to causing a malfunction in the second core 104. Additionally, since the second stress source 114 applies stress to different functional regions of the first core 102 and the second core 104 (at the corners 116 and 118, respectively), the type of malfunction that would occur at the first core 102 would likely be different than the type of malfunction that would occur at the second core 104. In either of these situations, the malfunction could be detected (e.g., by a compare unit) and a fault can be reported prior to a CCF occurring.

By implementing the asymmetric orientation in the manner described, the first core 102 and the second core 104 age at different rates. These different rates of aging can further reduce the probability of a CCF occurring, particularly a CCF caused by aging of the IC chip 100.

Figure 3:
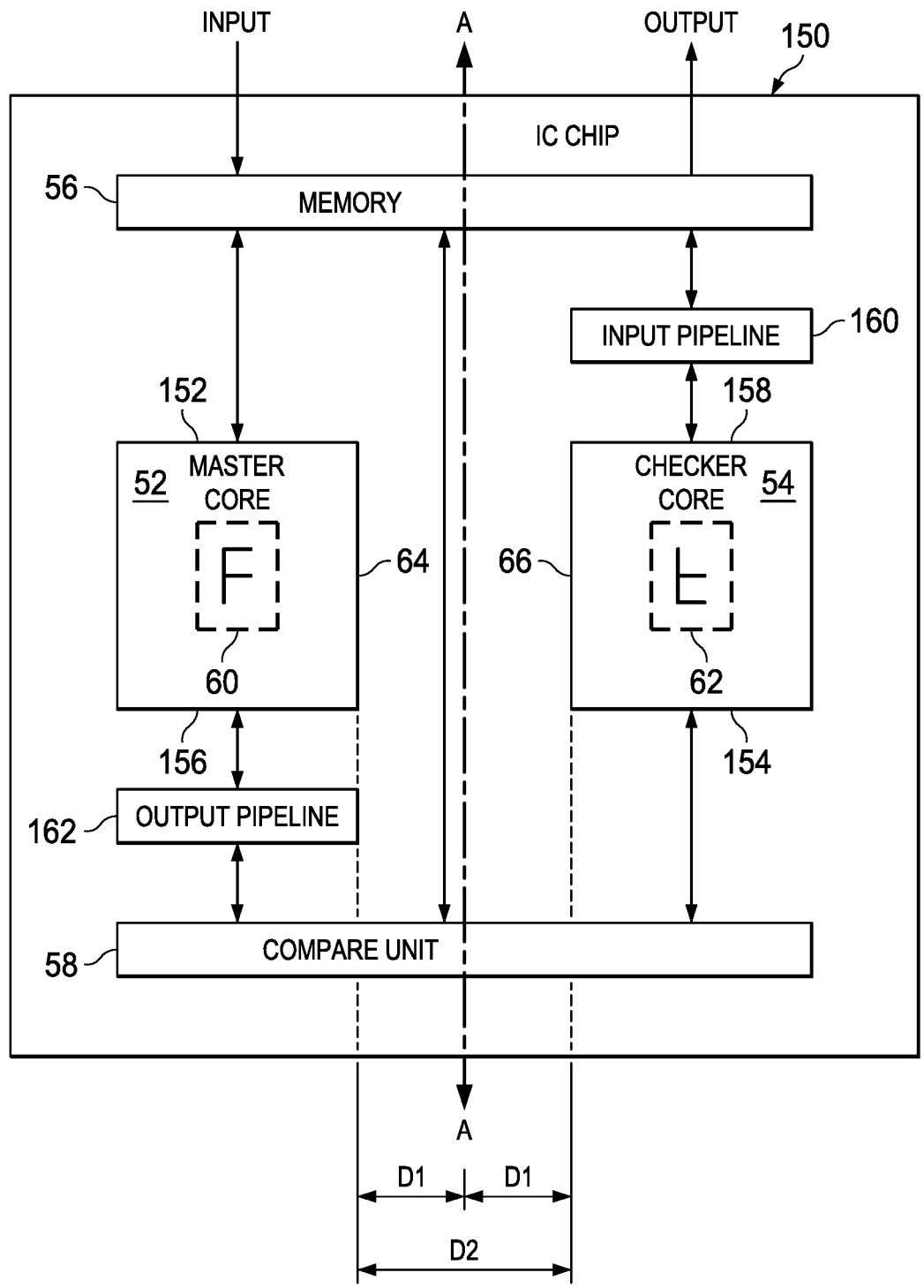
FIG. 3 illustrates another example of an IC chip with asymmetrically oriented cores.

FIG. 3 illustrates another example of an IC chip 150 that can be employed to reduce a probability of a CCF. The IC chip 150 can include two cores on a single die (or other common substrate). Moreover, the IC chip 150 can be implemented in a manner similar to the IC chip 50 illustrated in FIG. 1. Thus, the same reference numbers are employed in FIGS. 1 and 3 to denote the same structure.

Due to the flipping and rotation by 180 degrees by the checker core 54 relative to the master core 52, the distance between specific regions, including edges of the checker core 54 and other macroblocks of the IC chip 150 may be different than the distance between the corresponding replica regions of the master core 52 and the same macroblocks. For instance, a first edge 152 of the master core 52 can correspond to a first edge 154 of the checker core 54. Similarly, a second edge 156 of the master core 52 can correspond to a second edge 158 of the checker core 54. In such a situation, connectors (e.g., conductive traces) between the compare unit 58 and the master core 52 can have a different length than the connectors between the compare unit 58 and the checker core 54. Similarly, connectors (e.g., conductive traces) between the memory 56 and the master core 52 can have a different length than the connectors between the memory 56 and the checker core 54.

In some situations, such as situations where the IC chip 150 is formed with microfabrication techniques on a scale of 45 nanometers (nm) or smaller, timing issues due to the varied distances may arise. That is, a signal output from the master core 52 may arrive at another macroblock prior to the arrival of a corresponding signal from the checker core 54. In some situations, the differing arrival time may cause timing issues. Thus, to rectify the situation, a pipeline can be added. The pipeline can be an instruction pipeline (e.g., a macroblock) configured to add a specific amount of delay to a signal.

More particularly, in the IC chip 150, an input pipeline 160 can be inserted between the memory 56 and the checker core 54. The input pipeline 160 can apply a predetermined amount of delay to signals transmitted as input from the memory 56 to the checker core 54. The predetermined amount of delay can be selected to substantially match (e.g., within 10 nanoseconds) the added transit time of signals between the memory 56 and the master core 52. Accordingly, the predetermined delay added by the input pipeline 160 can ensure that input signals transmitted from the memory 56 arrive at the master core 52 and the checker core 54 at substantially the same time (e.g., within 10 nanoseconds).

Additionally or alternatively, an output pipeline 162 can be inserted between the master core 52 and the checker core 54. The output pipeline 162 can apply an predetermined amount of delay to an output signal transmitted from the master core 52 to the compare unit 58. The predetermined amount of delay can be selected to substantially match (e.g., within 10 nanoseconds) the added transit time of signals transmitted from the checker core 54 to the compare unit 58. In this manner, the predetermined delay can ensure that output signals transmitted from the master core 52 and the checker core 54 arrive at the compare unit 58 at substantially the same time (e.g., within 10 nanoseconds).

It is noted that the input pipeline 160 and the output pipeline 162 are only two examples of possible pipelines between macroblocks of the IC chip 150. For instance, in some examples, the same core can be coupled to multiple pipelines, and a corresponding replica core (e.g., that is flipped and rotated 180 degrees) may not be coupled to any pipelines. Accordingly, the number and placement of the pipelines can vary based on the architecture of the IC chip 150.

By implementing the IC chip 150 in the manner illustrated and described, the probability of a CCF occurring can be reduced. Additionally, as noted, including pipelines between macroblocks (including the input pipeline 160 and/or the output pipeline 162) can be implemented to account for timing issues that may otherwise arise from flipping and rotating a replica core (e.g., the checker core 54) by 180 degrees.

Furthermore, the design of the IC chip 150 avoids the need for more complicated fabrication techniques. For example, the IC chip 150 can avoid the need for asymmetry for timing critical paths in the master core 52 and/or the checker core 54. Additionally, the design of the IC chip 150 avoids the need to harden the master core 52 and the checker core 54 separately by compensating for asymmetry at a signal level inside the master core 52 and the checker core 54.

Figure 4:
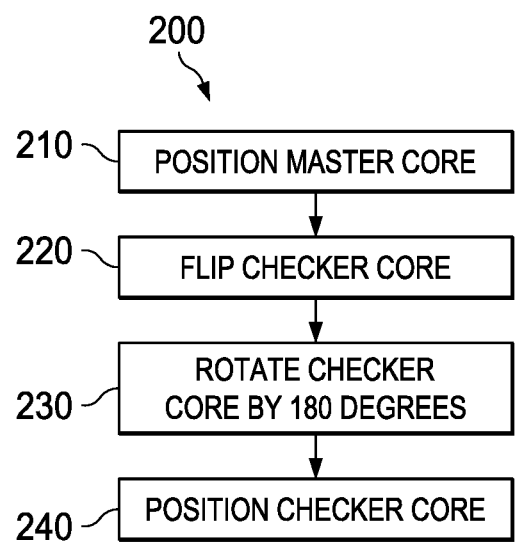
FIG. 4 illustrates a flowchart of an example of a method for fabricating an IC chip with asymmetrically oriented cores.

In view of the foregoing structural and functional features described above, an example method will be better appreciated with reference to FIG. 4. While, for purposes of simplicity of explanation, the example method of FIG. 4 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method. The example method of FIG. 4 can be implemented as instructions stored in an IC chip (e.g., as firmware) that are executable by a processor (e.g., a microcontroller) and/or as logic (e.g., an FPGA).

FIG. 4 illustrates an example of a method 200 for fabricating an IC chip with a pair of matched cores with asymmetric orientation. The method 200 can be implemented for example, to implement the IC chip 50 illustrated in FIG. 1 and/or the IC chip 150 illustrated in FIG. 3. Thus, the pair of matched cores can operate in lockstep.

At 210, a master core (e.g., the master core 52 of FIG. 1) of the matched cores can be positioned on the IC chip. At 220, a checker core (e.g., a checker core 54 of FIG. 1) of the pair of the matched cores can be flipped. At 230, the checker core can be rotated by an angle of 180 degrees. At 240, the checker core can be positioned on the IC chip, such that the checker core is asymmetrically oriented with respect to the master core.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A method, comprising:
   forming at least a portion a first core with a 45 nanometer or smaller microfabrication technique, the first core having an output and a first orientation on a substrate;
   forming at least a portion of a second core with a 45 nanometer or smaller microfabrication technique, the second core having an output and a second orientation on the substrate, the second core is a replica of the first core and the second orientation is different than the first orientation; and
   forming at least a portion of a compare unit with a 45 nanometer or smaller microfabrication technique, the compare unit having a first input and a second input on the substrate, the first input coupled to the output of the first core and the second input coupled to the output of the second core.

2. The method of claim 1, wherein the second orientation is flipped with respect to the first orientation.

3. The method chip of claim 1, wherein the second orientation is rotated 180 degrees with respect to the first orientation.

4. The method of claim 1, wherein the second orientation is flipped and rotated 180 degrees with respect to the first orientation.

5. The method of claim 1, wherein a first data at the output of the first core a second data at the output of the second core are transmitted at substantially the same time.

6. The method of claim 1, further comprising a memory, wherein the first core and the second core are configured to access the memory.

7. The method of claim 6, further comprising a pipeline coupled between the memory and one of the first and the second cores.

8. The method of claim 1, further comprising a pipeline coupled between the compare unit and one of the first and the second cores.

9. The method of claim 8, wherein data transmitted from each of the first core and the second core arrives are transmitted at substantially the same time.

10. The method of claim 1, wherein the first core and the second core are configured to operate in lockstep.

11. The method of claim 1, wherein the first core and the second core are each general purpose processors configured to execute machine readable instructions.

12. The method of claim 1, wherein no point in space is equidistance from the same region of electrical components to both the first core and the second core.

* * * * *